United States Patent
Liu et al.

(10) Patent No.: US 10,580,951 B2
(45) Date of Patent: Mar. 3, 2020

(54) PACKAGE STRUCTURE FOR BACKLIGHT MODULE

(71) Applicant: UNIFLEX Technology Inc., Taichung (TW)

(72) Inventors: Yi-Chun Liu, New Taipei (TW); Ying-Hsing Chen, Taichung (TW); Bo-Hua Chen, Miaoli County (TW); Yuan-Chih Lee, Taoyuan (TW)

(73) Assignee: UNIFLEX Technology Inc., Taichung (TW)

( * ) Notice: Subject to any disclaimer, the term of this patent is extended or adjusted under 35 U.S.C. 154(b) by 0 days.

(21) Appl. No.: 16/040,546

(22) Filed: Jul. 20, 2018

(65) Prior Publication Data
US 2019/0305200 A1 Oct. 3, 2019

(30) Foreign Application Priority Data
Mar. 27, 2018 (TW) .............................. 107110444 A

(51) Int. Cl.
*H01L 33/58* (2010.01)
*H01L 33/62* (2010.01)
*H01L 33/60* (2010.01)
*H01L 33/48* (2010.01)

(52) U.S. Cl.
CPC ............ *H01L 33/62* (2013.01); *H01L 33/486* (2013.01); *H01L 33/60* (2013.01)

(58) Field of Classification Search
CPC .................................................. H01L 29/7813
See application file for complete search history.

(56) References Cited

U.S. PATENT DOCUMENTS

| 7,855,415 B2 * | 12/2010 | Challa ................. H01L 21/3065 257/341 |
| 9,306,029 B2 * | 4/2016 | Fragapane ........ H01L 29/66348 |
| 2008/0067533 A1 * | 3/2008 | Lim ...................... H01L 33/486 257/98 |

(Continued)

FOREIGN PATENT DOCUMENTS

| TW | 200529714 | 9/2005 |
| TW | M486861 | 9/2014 |

(Continued)

OTHER PUBLICATIONS

Office Action of Taiwan Counterpart Application, dated Dec. 21, 2018, pp. 1-6.

*Primary Examiner* — Thao P Le
(74) *Attorney, Agent, or Firm* — JCIPRNET

(57) ABSTRACT

A package structure for a backlight module includes a flexible base film, a plurality of pads, a light-emitting component, a patterned circuit layer. The flexible base film includes a plurality of conductive vias, a first surface, and a second surface opposite to the first surface. The conductive vias connect the first surface and the second surface. In addition, a material of the flexible base film includes polyimide and white fillings. The pads are disposed on the first surface. The conductive vias are connected to the pads. The light-emitting component is disposed on the pads and electrically connected to the pads. The patterned circuit layer is disposed on the second surface and electrically connected to the conductive vias.

10 Claims, 4 Drawing Sheets

(56) References Cited

U.S. PATENT DOCUMENTS

| | | | | |
|---|---|---|---|---|
| 2010/0044785 A1* | 2/2010 | Murphy | ............. | H01L 29/7813 |
| | | | | 257/330 |
| 2011/0215354 A1* | 9/2011 | Wang | ..................... | H01L 33/58 |
| | | | | 257/98 |
| 2013/0176739 A1* | 7/2013 | Uehara | ..................... | F21V 7/00 |
| | | | | 362/296.01 |
| 2014/0020935 A1* | 1/2014 | Uehara | ................ | H05K 1/0277 |
| | | | | 174/254 |
| 2017/0200799 A1* | 7/2017 | Amali | ................... | H01L 29/407 |

FOREIGN PATENT DOCUMENTS

| | | |
|---|---|---|
| TW | M522540 | 5/2016 |
| TW | 201739072 | 11/2017 |

* cited by examiner

PACKAGE STRUCTURE FOR BACKLIGHT MODULE

CROSS-REFERENCE TO RELATED APPLICATION

This application claims the priority benefit of Taiwan application serial no. 107110444, filed on Mar. 27, 2018. The entirety of the above-mentioned patent application is hereby incorporated by reference herein and made a part of this specification.

BACKGROUND OF THE INVENTION

1. Field of the Invention

The disclosure relates to a package structure, and particularly relates to a package structure for a backlight module.

2. Description of Related Art

As smart electronic apparatuses become much thinner and internal circuits are designed to be much denser, adopting a reliable heat dissipation design inside an electronic apparatus has become the basic requirement to ensure smooth operation of an apparatus. Currently, an artificial graphite film prepared from a polyimide film exhibits a thinner thickness, a higher thermal conductivity, and is flexible and easy to process. Therefore, such artificial graphite film can satisfy the heat dissipation design requirement for a limited space inside an electronic apparatus, and such artificial graphite film has become an important heat dissipation material for a heat dissipation structure inside various smart mobile electronic apparatuses.

Besides, through the development of technologies in aeronautics, electronics, and batteries, people having more diversified and fine-grained demands on the properties of polyimide film materials for some specific occasions. Now, different polyimide film products showing characteristics different than previous polyimide films are already developed. For example, corona-resistant polyimide film products, low-k polyimide film products, transparent polyimide film products, and the like have been developed. In some specific fields, such as those relating to flexible LED strips and backlight modules for displays, the industry prefers a polyimide film having a significantly higher reflectivity.

To facilitate the reflectivity of a polyimide film, it is known to additionally form a white film (e.g., a white resin film) or coat a baking ink or a photosensitive ink on the polyimide film to thereby form a dual-layered polyimide film. While such process helps render a desired whiteness in the polyimide film, additionally forming the white film may increase the manufacturing cost and bring an undesired effect on film properties. Particularly, since the resin coating is less thermal resistant, the dual-layered polyimide film may easily deteriorate or discolored when being exposed to a high-temperature environment.

SUMMARY OF THE INVENTION

One or some exemplary embodiments of the disclosure provides a package structure for a backlight module, wherein a flexible base film of the package structure has a higher reflectivity, a lower manufacturing cost, and does not easily deteriorate or discolored.

An embodiment of the disclosure provides a package structure for a backlight module. The package structure has a flexible base film, a plurality of pads, a light-emitting component, and a patterned circuit layer. The flexible base film includes a plurality of conductive vias, a first surface, and a second surface opposite to the first surface. The conductive vias connect the first surface and the second surface. In addition, a material of the flexible base film includes polyimide and white fillings. The pads are disposed on the first surface. The conductive vias are connected to the pads. The light-emitting component is disposed on the pads and electrically connected to the pads. The patterned circuit layer is disposed on the second surface and electrically connected to the conductive vias.

According to an embodiment of the disclosure, the flexible base film is white.

According to an embodiment of the disclosure, a reflectivity of the flexible base film is higher than a reflectivity of polyimide.

According to an embodiment of the disclosure, a reflectivity of the flexible base film with respect to visible light is greater than 80%.

According to an embodiment of the disclosure, a diameter of each of the conductive vias substantially ranges from 10 μm to 50 μm.

According to an embodiment of the disclosure, the conductive vias include a plurality of electrically conductive vias and a plurality of thermally conductive vias, and one of the electrically conductive vias and one of the thermally conductive vias are connected to one of the pads.

According to an embodiment of the disclosure, the light-emitting component includes a mini light emitting diode (LED), a micro LED, or an LED.

According to an embodiment of the disclosure, the pads are physically isolated from each other on the first surface.

According to an embodiment of the disclosure, a thickness of the flexible base film substantially ranges from 10 μm to 30 μm.

According to an embodiment of the disclosure, the package structure for the backlight module further includes a coverlay disposed on the second surface and covering the patterned circuit layer.

Based on the above, in the package structure for the backlight module according to the embodiments of the disclosure, the flexible base film is mixed with the white filings, and the light-emitting component is disposed on the white (or a color whose brightness is very close to that of white) flexible base film mixed with the white fillings. Accordingly, the reflectivity of the flexible base film is significantly increased, and the light-emitting efficiency of the backlight module using the package structure is improved, and the issue that the white coating may easily crack and be separated from the yellow polyimide in the known art is avoided. In addition, the flexible base film mixed with the white fillings according to the embodiments of the disclosure is high heat resistant and does not discolor or crack easily. Thus, such flexible base film better fits a high heat resistant requirement when the light-emitting component is used for illumination or used in a backlight module. Consequently, the quality and the stability of the package structure are improved.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated

DESCRIPTION OF THE EMBODIMENTS

Figure 1:
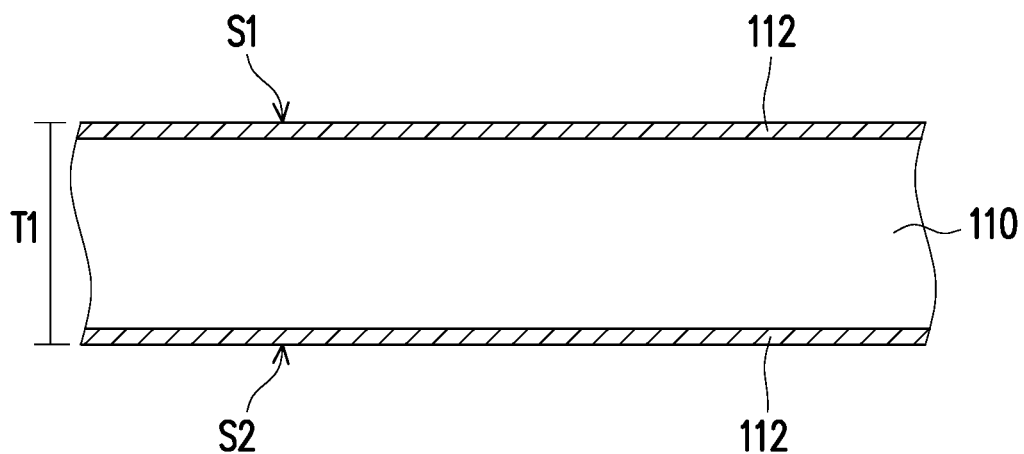
FIGS. 1 to 5 are schematic cross-sectional views illustrating a manufacturing process of a package structure for a backlight module according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

It is to be understood that both the foregoing and other detailed descriptions, features, and advantages are intended to be described more comprehensively by providing embodiments accompanied with figures hereinafter. In the following embodiments, wordings used to indicate directions, such as "up," "down," "front," "back," "left," and "right", merely refer to directions in the accompanying drawings. Therefore, the directional wording is used for an illustrative purpose and shall not be construed as a limitation on the disclosure. Meanwhile, in the following embodiments, like or similar elements are referred to with like or similar reference symbols.

FIGS. 1 to 5 are schematic cross-sectional views illustrating a manufacturing process of a package structure for a backlight module according to an embodiment of the disclosure. A method for manufacturing a package structure 100 for a backlight module according to the embodiment includes the following structure. First of all, referring to FIG. 1, a flexible base film 110 is provided. The flexible base film 110 includes a first surface S1 and a second surface S2 opposite to the first surface S1. In addition, a material of the flexible base film 110 includes polyimide (PI) and white fillings. In other words, the flexible base film 110 of the embodiment may include polyimide as a base material, and may be formed by mixing polyimide with the white fillings. Accordingly, the flexible base film 110 mixed with the white fillings is substantially white or in a light color having a brightness very close to that of white.

Accordingly, in the embodiment, a reflectivity of the flexible base film 110 may be substantially greater than a reflectivity of polyimide. Namely, the reflectivity of the flexible base film 110 mixed with the white fillings is substantially greater than the reflectivity of polyimide without the white fillings. As an example, the reflectivity of the flexible base film 110 may be at least greater than or equal to 80%. Nevertheless, the embodiment does not intend to limit the material of the flexible base film 110. In other embodiments, the flexible base film 110 may also be formed by mixing another flexible base material with the white fillings. In the embodiment, the flexible base film 110 may further include metal foil layers 112 respectively disposed on an upper surface and a lower surface of the flexible base film 110. In the embodiment, the metal foil layer 112 may be a copper foil, for example, and may be laminated onto the flexible base film 110. In other words, the flexible base film 110 may be a flexible copper clad laminate (FCCL) that is white or in a color whose brightness is very close to white. In the embodiment, a thickness T1 of the flexible base film 110 substantially ranges from 10 vim to 30 μm.

Figure 2:
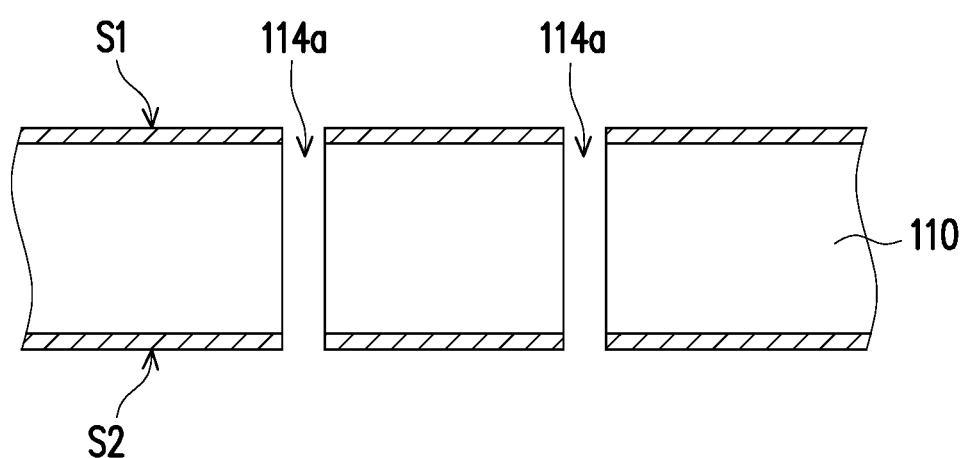

Then, referring to FIG. 2, a plurality of through holes 114a are formed on the flexible base film 110. The through holes 114a may penetrate through the flexible base film 110 to connect the first surface S1 and the second surface S2. In the embodiment, the through holes 114a may be formed by laser drilling, so as to form the through holes 114a having a smaller aperture size and thereby reduce a pitch between conductive vias 114 in the package structure 110. Accordingly, the package structure 100 may meet a fine pitch requirement. Nevertheless, the embodiment does not intend to limit the methods and means for forming the through holes. The through holes may also be formed by other means that people having ordinary skills in the art are familiar with. In the embodiment, a diameter of the through hole 114a formed by laser drilling substantially ranges from 10 μm to 50 μm. Alternatively, in other embodiments, the through holes 114a may also be formed by etching. In this way, the through holes 114a can be formed quickly in batch production. Therefore, the manufacturing efficiency is facilitated, and the production cost is reduced. The embodiment does not intend to limit how the through holes 114a are formed.

Figure 3:
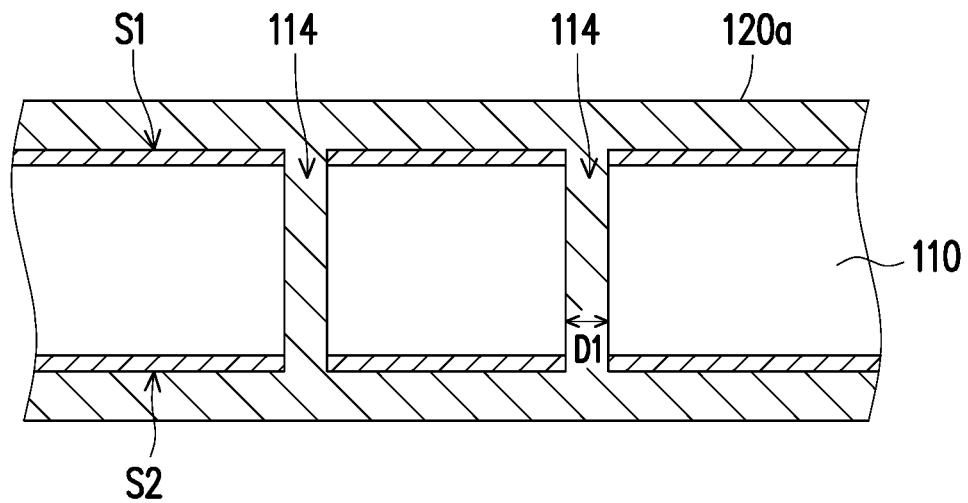

Then, referring to FIG. 3, a metal layer 120a is formed on the flexible base film 110 and covers inner walls of the through holes 114a. For example, formation of the metal layer 120a may include the following. First of all, a chemical plating process is performed to form a seed layer (not shown) on the flexible base film 110. The seed layer may completely cover the first surface S1 and the second surface S2 of the flexible base film 110 and the inner walls of the through holes 114a. The chemical plating process is an auto-catalyzed reduction-oxidation reaction carried out by, for example, using a chemical copper plating solution during a chemical copper plating process such that the metal ions are reduced to metal by gaining electrons. In the embodiment, a material of the seed layer may include copper, nickel, or other suitable materials.

Then, by using the seed layer as an electrically conductive path, a plating process is performed to form the metal layer 120a on the flexible base film 110 as shown in the drawing. In the embodiment, a material of the metal layer 120a may include copper or other suitable materials. In the embodiment, the metal layer 120a may completely fill the through holes 114a to form the conductive vias 114 connecting the first surface S1 and the second surface S2 as shown in FIG. 3. In the embodiment, a diameter D1 of the conductive via 114 substantially ranges from 10 μm to 50 μm.

Figure 4:
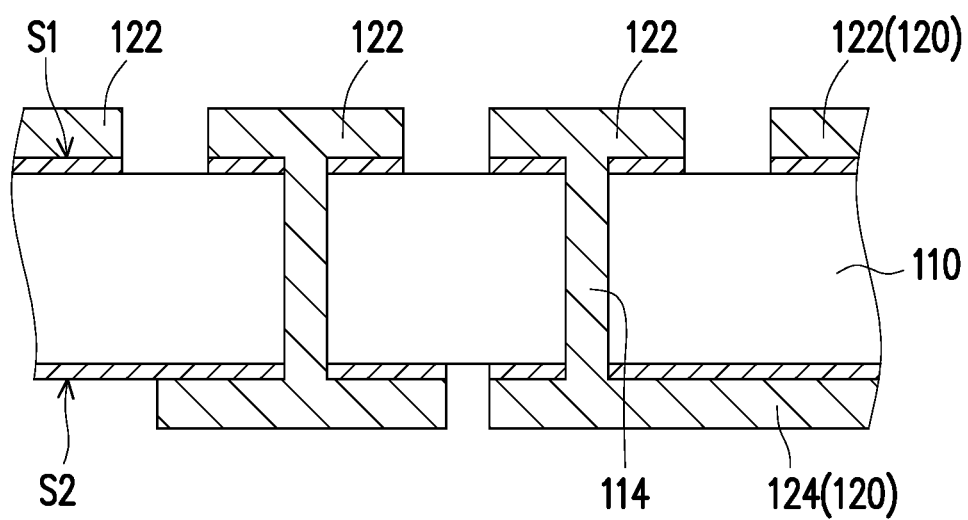

Then, referring to FIG. 4, a patterning process is performed on the metal layer 120a to form a patterned metal layer 120 as shown in FIG. 4. In the embodiment, the patterning process may include the following. First of all, a photoresist layer (not shown) exposing a portion of the metal layer 120a may be formed on the metal layer 120a, for example. Then, a patterning process (e.g. etching process) is performed on the metal layer 120a and the seed layer to remove the portion of the metal layer 120a exposed by the photoresist layer and the seed layer. Accordingly, the patterned metal layer 120 shown in FIG. 4 is formed. A wiring process as described above is only provided as an example. The embodiment does not intend to limit how the patterned metal layer 120 is formed. Other than a semi-additive process, the patterned metal layer 120 may also be manufactured by performing an additive process, a subtractive process, or other processes people having ordinary skills in the art are known of.

Figure 6:
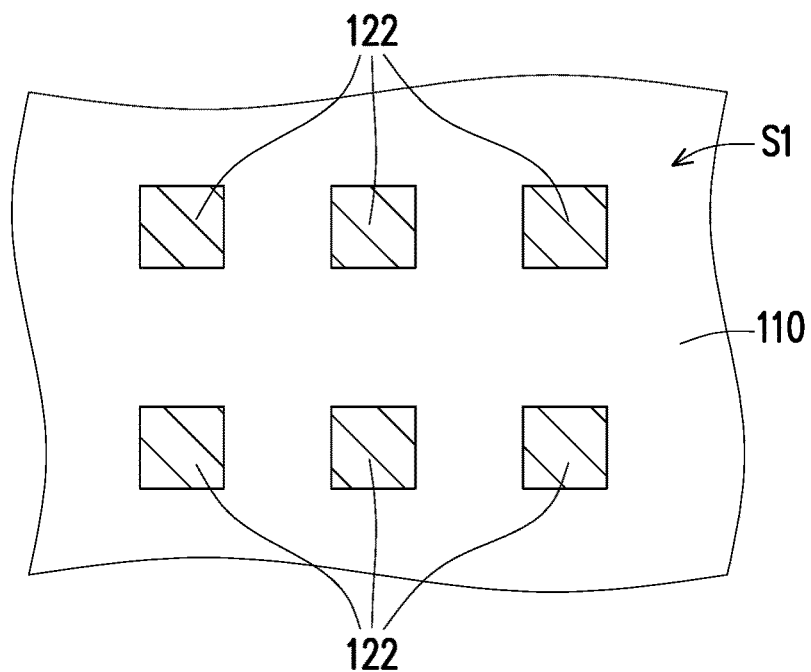
FIG. 6 is a schematic top view illustrating a flexible base film of a package structure for a backlight module according to an embodiment of the disclosure.

FIG. 6 is a schematic top view illustrating a flexible base film of a package structure for a backlight module according to an embodiment of the disclosure. Referring to FIGS. 4 and 6, in the embodiment, the patterned metal layer 120 includes a plurality of pads 122 and a patterned circuit layer 124. The pads 122 are disposed on the first surface S1. In addition, in the embodiment, the conductive vias 114 may be respectively disposed below the pads 122 to be respectively connected to the pads 122. The patterned circuit layer 124 is disposed on the second surface S2 and electrically connected to the conductive vias 114. In the embodiment, the pads 112 may be physically isolated from each other on the first surface S1, as shown in FIG. 6. In other words, there is no other wiring connecting the pads 122 on the first surface S1, and the pads 122 are disposed on the first surface S1 as islands. The pads 122 may be electrically conductive to the second surface S2 through the conductive vias 114 and electrically connected with each other via the patterned circuit layer 124. With such a structure configuration, the first surface S1 of the flexible base film 110 does not have any wiring except for the pads 112. All the wiring is arranged on the second surface S2 of the flexible base film 110 and electrically connected with the pads 122 via the conductive vias 114. Therefore, a wiring space is omitted from the first surface S1, such that the pitch between the pads 122 may be further reduced, and the pads 122 may be more densely arranged. Accordingly, a device density of a light-emitting component disposed on the pads 122 may thus be increased.

Figure 5:
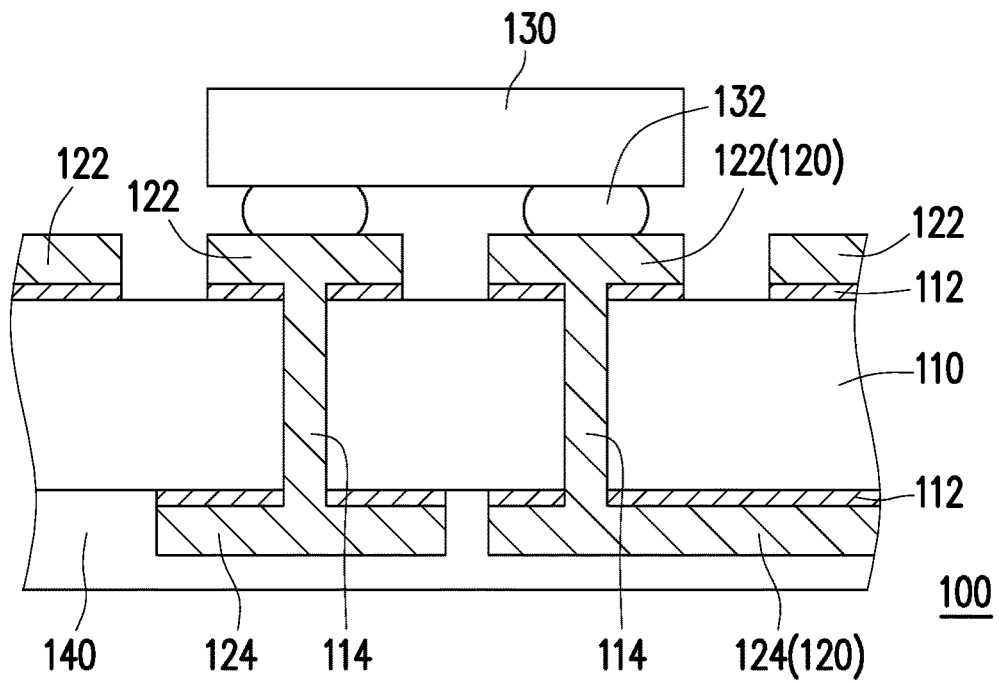

Then, referring to FIG. 5, at least one light-emitting component 130 is disposed on the pads 122. In addition, the light-emitting component 130 is electrically connected with the pads 122. In the embodiment, the light-emitting component 130 may be a mini LED. In general, the mini LED refers to a light emitting diode as the light-emitting component 130 having a size of about 100 μm. Nevertheless, the embodiment is described herein merely as an example and the disclosure is not limited thereto. The light-emitting component 130 may be bonded with the pads 122 on the first surface S1 of the flexible base film 110 by flip-chip bonding through a plurality of solder balls 132, for example. In the embodiment, a plurality of the light-emitting components 130 may be disposed as an array on the first surface S1 of the flexible base film 110. Then, a coverlay 140 may be disposed on the second surface S2 of the flexible base film 110 and cover the patterned circuit layer 124 on the second surface S2 to protect the patterned circuit layer 124 from oxidation or external contaminations. In the embodiment, the coverlay 140 may be optionally disposed. In addition, the coverlay 140 may be a transparent or opaque coverlay. In other embodiments, the overlay may also be disposed on the first surface S1 of the flexible base film 110, and the overlay covering the first surface S1 is a transparent overlay. Accordingly, the method for manufacturing the package structure 100 for the backlight module in the embodiment is substantially completed.

With such a structure configuration, the flexible base film 110 is mixed with the white fillings and the light-emitting component 130 is disposed on the white (or a color whose brightness is very close to that of white) flexible base film 110 in the package structure 100 for the backlight module according to the embodiment. Therefore, the light-emitting component 130 is capable of stably emitting white light, and the reflectivity of the flexible base film is increased significantly. Thus, the light-emitting efficiency of the backlight module using the package structure 100 is improved. Besides, compared with the known technique of additionally coating a white coating layer on yellow polyimide, the flexible base film 110 mixed with the white fillings in the embodiment omits the white coating layer which cracks easily and may be easily separated from the yellow polyimide, and also reduces the overall thickness (to a range from about 10 μm to 30 μm) of the flexible base film 110. Moreover, the flexible base film 110 mixed with the white fillings of the embodiment is high heat resistant. Even after being exposed to a high temperature for thousands of hours, the flexible base film 110 of the embodiment does not discolor or crack easily. Thus, the flexible base film 110 fits well in the high-temperature condition when the light-emitting component 130 is used for illumination or used in a backlight module and emits light for thousands of hours.

Furthermore, the flexible base film 110 has the flexible property, making it suitable to be used with an organic light-emitting diode (OLED) also known for being flexible. Therefore, the flexible base film 110 of the embodiment may be used in a backlight module for a flexible display. Besides, in the embodiment, the pads 122 on the first surface S1 are electrically conductive to the patterned circuit layer 124 on the second surface S2 through the conductive vias 114, so as to be electrically connected with each other. Therefore, a wiring space is omitted from the first surface S1 of the flexible base film 110, the pitch between the pads 122 may be reduced, and the pads 122 may be more densely arranged. Accordingly, a device density of a light-emitting component 130 disposed on the pads 122 may thus be increased. Therefore, the package structure 100 of the embodiment is suitable for a backlight module having a finer pitch requirement, such as a backlight module for mini LEDs.

Figure 7:
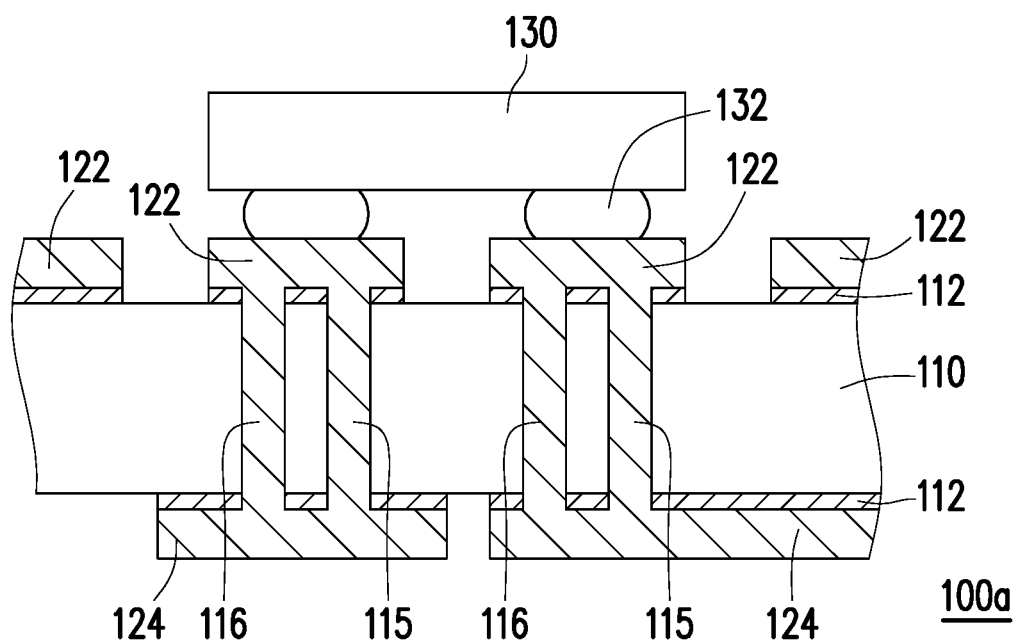
FIG. 7 is a schematic cross-sectional view illustrating a package structure for a backlight module according to an embodiment of the disclosure.

FIG. 7 is a schematic cross-sectional view illustrating a package structure for a backlight module according to an embodiment of the disclosure. A package structure 100a of the embodiment is similar to the embodiment of FIG. 5. Therefore, the reference symbols and part of the contents of the previous embodiment are also used in the embodiment. In addition, like reference symbols are used to refer to like or similar components, and repeated technical contents are omitted. For a detailed description of the omitted parts, reference can be found in the previous embodiment, and no repeated description is contained in the following embodiment. Referring to FIG. 7, the following descriptions focus on the difference between the package structure 100a of the embodiment and the package structure 100 of FIG. 5.

Referring to FIG. 7, in the embodiment, the conductive vias 114 may include a plurality of electrically conductive vias 115 and a plurality of thermally conductive vias 116. In addition, one of the electrically conductive vias 115 and one of the thermally conductive via 116 are both connected to one of the pads 122. In other words, each of the pads 122 may be connected to one of the electrically conductive vias 115 and one of the thermally conductive vias 116 at the same time. The electrically conductive vias 115 may be electrically connected to the light-emitting component 130 through the pads 122, while the thermally conductive vias 116 may be thermally coupled to the pads 122, so that the heat generated by the light-emitting component 130 may be transmitted to the patterned circuit layer 124 on the second surface S2 to dissipate heat through a heat transmission path formed by the pads 122 and the thermally conductive vias 116. Moreover, in the embodiment, a heat dissipation sheet may be further attached to the second surface S2 of the package structure 100a to dissipate the heat transmitted to the second surface S2 to an external environment.

Nevertheless, the embodiment is only described herein for an illustrative purpose, and the embodiment does not intend to limit how the package structures 100 and 100a dissipate heat. In other embodiments, at least one of the thermally conductive vias 114 connected to the light-emitting component 130 may serve as a thermally conductive via and be thermally coupled with the pad 122, while rest of the conductive vias 114 are electrically conductive vias and electrically connected with the light-emitting component 130. In other words, each of the pads 122 is still connected with one of the conductive vias 114, as shown in FIG. 5, but some of the pads 122 are connected to the thermally conductive vias to transmit heat, while some of the pads 122 are connected to the electrically conductive vias to transmit electricity. Alternatively, each of the conductive vias 114 may transmit heat as well as electricity. Under the circumstance, the light-emitting component 130 is electrically connected to the patterned circuit layer 124 on the second surface S2 and the heat generated by the light-emitting component 130 is also transmitted to the patterned circuit layer 124 on the second surface S2 to dissipate heat.

In view of the foregoing, in the package structure for the backlight module according to the embodiments of the disclosure, the flexible base film is mixed with the white filings, and the light-emitting component is disposed on the white (or a color whose brightness is very close to that of white) flexible base film mixed with the white filings. Accordingly, the reflectivity of the flexible base film is significantly increased, and the light-emitting efficiency of the backlight module using the package structure is improved, and the issue that the white coating may easily crack and be separated from the yellow polyimide in the known art is avoided. Therefore, the package structure according to the embodiments of the disclosure has a higher yield rate and higher stability.

Moreover, in some embodiments, the pads are electrically conductive to the patterned circuit layer on the second surface through the conductive vias, so as to be electrically connected with each other. Therefore, a wiring space is omitted on the first surface of the flexible base film, so the pitch between the pads may be reduced. Accordingly, the device density of the light-emitting component disposed on the pads may be thus be increased. Hence, the package structure according to the embodiments of the disclosure is suitable for a backlight module having a finer pitch requirement.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A package structure for a backlight module, comprising:
   a flexible base film, comprising a plurality of conductive vias, a first surface, and a second surface opposite to the first surface, wherein the conductive vias connect the first surface and the second surface, and a material of the flexible base film comprises polyimide and white fillings;
   a plurality of pads, disposed on the first surface, wherein the conductive vias are connected to the pads;
   a light-emitting component, disposed on the pads and electrically connected to the pads; and
   a patterned circuit layer, disposed on the second surface and electrically connected to the conductive vias.

2. The package structure for the backlight module as claimed in claim 1, wherein the flexible base film is white.

3. The package structure for the backlight module as claimed in claim 1, wherein a reflectivity of the flexible base film is higher than a reflectivity of polyimide.

4. The package structure for the backlight module as claimed in claim 1, wherein a reflectivity of the flexible base film with respect to visible light is greater than 80%.

5. The package structure for the backlight module as claimed in claim 1, wherein a diameter of each of the conductive vias substantially ranges from 10 μm to 50 μm.

6. The package structure for the backlight module as claimed in claim 1, wherein the conductive vias comprise a plurality of electrically conductive vias and a plurality of thermally conductive vias, and one of the electrically conductive vias and one of the thermally conductive vias are connected to one of the pads.

7. The package structure for the backlight module as claimed in claim 1, wherein the light-emitting component comprises a mini light emitting diode (LED), a micro LED, or an LED.

8. The package structure for the backlight module as claimed in claim 1, wherein the pads are physically isolated from each other on the first surface.

9. The package structure for the backlight module as claimed in claim 1, wherein a thickness of the flexible base film substantially ranges from 10 μm to 30 μm.

10. The package structure for the backlight module as claimed in claim 1, further comprising a coverlay disposed on the second surface and covering the patterned circuit layer.

* * * * *